United States Patent [19]

Volpe

[11] Patent Number: 5,547,601
[45] Date of Patent: Aug. 20, 1996

[54] CFC-FREE SOLVENT FOR SOLVATING SOLDER FLUX

[75] Inventor: John J. Volpe, Milford, Mass.

[73] Assignee: JNJ Industries, Inc., Milford, Mass.

[21] Appl. No.: 174,875

[22] Filed: Dec. 28, 1993

Related U.S. Application Data

[63] Continuation-in-part of Ser. No. 942,311, Sep. 9, 1992, abandoned.

[51] Int. Cl.$^6$ .............................. C11D 7/50; C11D 7/26; C11D 17/04
[52] U.S. Cl. .................. 15/104.93; 15/209.1; 15/210.1; 510/175; 510/407
[58] Field of Search .................. 424/288; 252/170, 252/172, DIG. 8, DIG. 10, 91

[56] References Cited

U.S. PATENT DOCUMENTS

| | | | |
|---|---|---|---|
| 3,882,038 | 5/1975 | Clayton et al. | 252/164 |
| 3,886,099 | 5/1975 | Hall | 252/548 |
| 4,808,235 | 2/1989 | Woodson et al. | 134/22.19 |
| 4,931,201 | 6/1990 | Julemont et a. | 252/91 |
| 4,983,224 | 1/1991 | Mombrun et al. | 134/40 |
| 5,094,770 | 3/1992 | Sheridan et al. | 252/91 |
| 5,185,235 | 2/1993 | Sato et al. | 430/331 |
| 5,330,582 | 7/1994 | Chihara et al. | 134/40 |
| 5,437,808 | 8/1995 | Weltman et al. | 252/170 |
| 5,454,969 | 10/1995 | Fields et al. | 252/162 |

FOREIGN PATENT DOCUMENTS

| | | |
|---|---|---|
| 330379 | 8/1989 | European Pat. Off. . |
| 464652 | 1/1992 | European Pat. Off. . |
| 150685 | 6/1990 | Japan . |
| 336336 | 8/1991 | Japan . |
| 0459898 | 2/1992 | Japan . |
| 125395 | 5/1993 | Japan . |

OTHER PUBLICATIONS

Adamchuck & Huckman, Propylene Based Glycol Ethers and Acetates as Substitutes for Methylene Chloride in Solvent Applicants, Apr. 1988 pp. 3–7.
JNJ Industries, Material Safety Data Sheet Rosstech 119 ME, Jul. 1992 pp. 1–2.

*Primary Examiner*—Paul Lieberman
*Assistant Examiner*—Michael P. Tierney
*Attorney, Agent, or Firm*—Samuels, Gauthier, Stevens & Reppert

[57] ABSTRACT

A presaturated wipe for cleaning the surface of a surface mount technology board, towels or wipes are saturated with a combination of 95 weight % glycol ethers and less than 5 weight % alcohols, the boards are cleaned with the presaturated wipe and do not require a rinse.

8 Claims, 1 Drawing Sheet

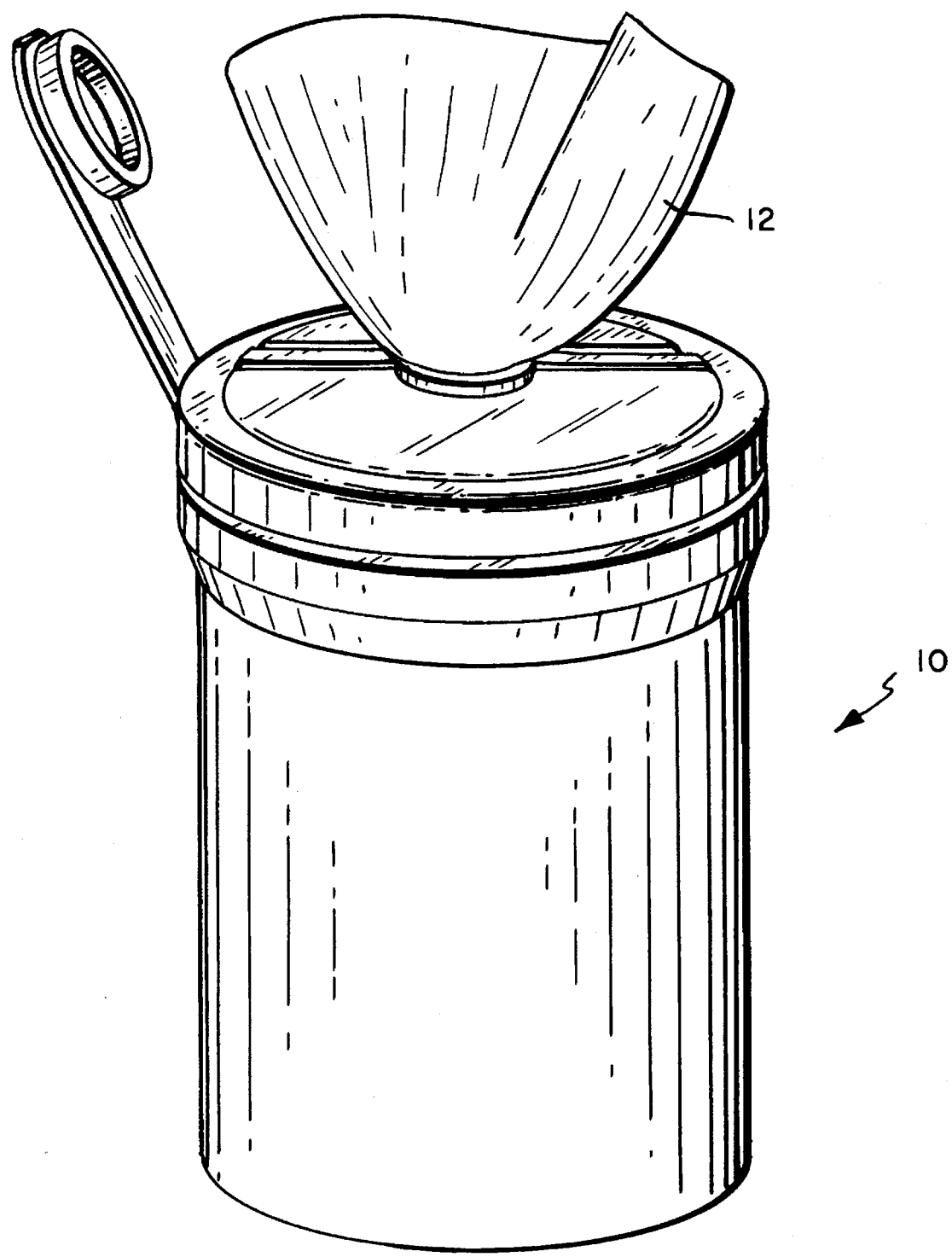

1

CFC-FREE SOLVENT FOR SOLVATING SOLDER FLUX

This is a continuation-in-part of U.S. patent application Ser. No. 07/942,311 filed Sep. 9, 1992 now abandoned, entitled "CFC-Free Solvent for Solvating Solder Flux".

BACKGROUND OF THE INVENTION

1. Field of the Invention

This invention relates to a disposable cloth having a solvent pre-saturated therein for cleaning printed circuit assembly equipment.

2. Description of the Prior Art and Brief Summary of the Invention

It is standard practice, in the manufacture of printed circuit boards and electronic assemblies, to use solder. The solder establishes both the physical and electrical connections of individual components to the circuit board. The solder attachment process typically requires flux to accomplish wetting of the metal surfaces to be joined in soldering. This flux is usually a gum rosin derivative. Other similar materials used in circuit manufacture include conductive and resistive inks, polymer thick films epoxies, and solder masks in viscous liquid form. These products are all applied to the circuit assembly via dispensing equipment or screen/stencil printers, or both. Due to the variances in the process, tight registration tolerances, and other factors, this material is not always applied properly; misprints and non-uniformly dispensed material must be cleaned off the assembly prior to re-printing or re-dispensing material on the same PC board or substrate.

A primary object of the present invention is to provide an efficient methodology for cleaning mis-printed assemblies utilizing a non-ozone depleting solvent that is non-toxic and non-flammable and formulated for the chemistry of the materials being cleaned. This solvent is impregnated in a cloth that must be a lint-free non-woven material capable of cleaning the substrate of all material while leaving behind no residue and no lint.

When applying a solvent to a cloth to clean, one may pour solvent onto it, which often results in spillage and waste; or one may use a pump-style dispensing can, which can dispense too much or too little, depending on the operator. Too little solvent on the cloth will result in the substrate not being cleaned completely. Furthermore, some types of solvents will carry contaminants into the PC board material and cause current leakage over time if the finished assembly operates in a humid environment. This can result in catastrophic failure of the assembly and equipment. To counter this, assemblies cleaned in such solvents must be washed in a batch-type cleaner and rinsed with distilled/deionized water. Also, solvent left in the pump can reservoir evaporates into the work environment. Many of these solvent types used contain ozone-depleting CFCs (Chlorofluorocarbons) (ex.: 1,1,1, Trichloroethylene, Xylene, Freon TMS, Acetone) and may have carcinogenic properties as well as being highly flammable.

One of the easiest ways to contact clean an object (i.e. wiping instead of immersion) and insure that the proper amount of solvent is fully saturated in the wipe is to purchase an airtight, resealable canister of disposable cloths with the cleaning solutions saturated therein. Various types of cloths have been impregnated with specific cleaning compounds and have designated tasks for which they will work. For example, there are presaturated cloths for disinfecting bathroom counter tops, cleaning mirrors, and cleaning babies.

A further object of the invention is to provide an improved formulation saturated in a disposable cloth. The cloth is for cleaning flux, solder paste, inks, and adhesives (uncured) from Surface Mount printed circuit boards and electronic assemblies, screens, stencils, tools, squeegees, and benchtops. The impregnated cloth according to the invention is low in odor and toxicity, non-flammable, biodegradable, and environmentally friendly. The specific cleaning composition is non-hazardous and free of CFCs. The composition dries fairly quickly without leaving a residue.

The present invention provides a canister having a number of disposable wipes therein. The wipes are presaturated with a solvent (ROSSTECH 119ME; Rossi Technology Corp.) having the formula $C_n O_m H_p$ wherein n=4 to 9, m=2 to 4, and p=10 to 18. The solvent consists of greater than 95.0% of glycol ethers, and less than 5.0% of alcohols.

BRIEF DESCRIPTION OF THE DRAWINGS

The drawing is an illustration of a canister embodying the invention.

DETAILED DESCRIPTION OF THE ILLUSTRATED EMBODIMENTS

When using solvents to clean printed circuit boards, some types of solvents will carry contaminants into the PC board material and cause current leakage over time if the finished assembly operates in a humid environment. This phenomenon is known as reducing the board's Surface Insulation Resistance, or SIR. Lowering a board's SIR can, in time, cause tin dendritic growth and eventually shorts or shunting, resulting in catastrophic failure of the assembly and equipment. Many types of CFC-based solvents are effective cleaners that remove all residue and do not affect board SIR, but these cleaners are unsuitable due to their ozone-depleting potential (ODP), and are being phased out. Most are unsuitable for benchtop use or operator contact and should not be inhaled. These solvents are usually contained in enclosed high-volume cleaning systems power vented to the outside.

With the rapid phaseout of ozone-depleting CFC solvents, several non-CFC solvents have appeared in the market place, such as terpene hydrocarbon solvents. These citrus-derived solvents are excellent rosin, oil, and flux cutters but do not remove polar, ionic, and other water-soluble contaminants found in flux. It is these contaminants that have the greatest impact on SIR; therefore, a rinsing step is necessary with distilled/deionized water when cleaning with terpenes. Furthermore, their strong citrus odor makes them unsuitable for use in the workplace where they can evaporate into the air. I have discovered a specific class of CFC-free solvent that is especially suitable for cleaning misprinted SMT PCBs and other electronic substrate. The solvent is non-toxic, non-hazardous, CFC-free and generally non-flammable. The solvent does not affect board SIR even without a rinsing step. Tests to determine SIR actually measure current leakage in a controlled experiment using test coupons, and the purpose is to determine that the solvent has not left a hygroscopic residue on or in the board that will become conductive and/or corrosive in a moist environment and allow current leakage across different paths on the surface of the board.

The solvent, ROSSTECH 119ME, (Rossi Technology Corp.) solvent represents a class of oxygenated compounds with a high flash point (DOT non-flammable) and low toxicity. They are non-halogenated, non-aromatic, and non-ozone depleting. This particular class of solvents was used in prior art for cleaning cermet conductive and resistive inks from hybrid microelectronic manufacturing screens and printers, and ceramic substrates, typically manufactured of alumina or beryllia. There was no suggestion based on the manufacturer's literature that this particular solvent would be suitable for cleaning PC boards, which are manufactured of layered epoxy/glass laminate materials. Unlike epoxy/glass, hybrid substrates are ceramic and are impermeable to solvents; therefore SIR is not a factor that applies to such assemblies. It was unexpectedly discovered that this particular solvent would clean PC boards and their assembly equipment without requiring a rinse step, since it was found that this material removes polar, ionic, and water soluble residues from flux and other materials.

The ROSSTECH 119ME solvent comprises greater than 95.0% of glycol ethers, preferably medium m. w. glycol ethers and less than 5.0% of alcohols, preferably isopropyl alcohols. The chemical formulation of the solvent is $C_nO_mH_p$, such that n=4 to 9, m=2 to 4, and p=10 to 18. The specific formulation of the solvent used in the test described below was comprised of greater than 90% of a glycol ether, specifically 1-propoxy-2-propanol, having the following structural formulation: $C_3H_7OCH_2CH(CH_3)OH_2$; less than 5% of a glycol ether, specifically 1-methoxy, 2-propanol having the following structural formulation: $C_4H_{10}O_2$; and less than 5% of alcohol, specifically isopropyl alcohol. The ROSSTECH 119ME solvent has a specific gravity of approximately 0.88 and an evaporation rate of 0.22 (0.22 is a comparative rate based on a butyl acetate evaporate rate of 1.0). It should also be noted that the melting/freezing point of the solvent is approximately $-70°$ C., whereas the boiling point of the solvent is $150°$ C. The ROSSTECH 119ME solvent will solvate flux from the surfaces of PC boards, and there is no remaining conductive residue that might permit current leakage across the surfaces of the board or substrate.

Test

In a test to determine how well the cleaning solvent worked, IPC Test Method 650, method 2.6.3.3, was used. The effects of ROSSTECH 119ME versus Trichloroethylene (TCE) on the SIR of epoxy/glass PCB test boards could be compared. Of the three classes of test conditions for this method, Class 3 was chosen. Class 3 is based on Mil (Military) standards of environmental exposure of 85° C./85% RH. The objective of the test was to compare the solvent utilized in the invention versus 1,1,1 Trichloroethylene (TCE) versus an uncleaned board, on the SIR of epoxy/glass PCB test coupons.

Prior to testing, the sample boards were prepared. IPC B-25 test boards with a comb pattern were initially cleaned with a soft bristle brush. After rinsing the boards with deionized water and isopropyl alcohol (IA), the boards were dried for 3 hours at 50° C. Next, the boards were fluxed with Alpha F, a commonly used RMA-type flux. The last step in the board preparation required that the boards be floated face-down in tin/lead solder at 500° F. for 5 seconds.

Three sets of boards were compared; only two sets of boards were cleaned, the third set was uncleaned. The two cleaning solvents employed with ROSSTECH 119ME and TCE. Three 500 ml beakers were set up for each of three cleaning solutions, the first for primary cleaning, and the next two for sequential rinsing. Temperature of the cleaning solutions was maintained at 100°–140° F.

After the final rinses of the board cleaning procedure, each set of boards was visually evaluated and rated on a scale of 1–10 with 10 being the cleanest. The results were as follows:

| | | |
|---|---|---|
| ROSSTECH 119ME | | 9, passes |
| TCE | | 10, passes |

| | TEST RESULTS (reading in ohms) | | |
|---|---|---|---|
| Set of boards | 24 hrs. | 96 hrs. | 168 hrs. |
| ROSSTECH 119ME | $5.5 \times 10^{10}$ | $1.2 \times 10^9$ | $7.4 \times 10^8$ |
| Uncleaned | $1.6 \times 10^{12}$ | $1.8 \times 10^{12}$ | $1.2 \times 10^{11}$ |
| TCE | $8.1 \times 10^9$ | $5.4 \times 10^8$ | $4.7 \times 10^8$ |

The performance criteria for MIL-F-14256E under these conditions is 100 MegOhm.

As indicated in the above table, uncleaned boards maintain the highest resistance. This can be explained by the flux, which acts as a conformal coating and moisture barrier to the leads, and the possibility that the solvents may at least partially penetrate the epoxy/glass laminate, having some effect on SIR values. AS also indicated in the table, at the 168-hour end-point, the ROSSTECH 119ME solvent set exceeded the resistance values of the TCE-cleaned set of boards.

For ease of application in cleaning substrates, it was desired to use premoistened wipes. These wipes were presaturated with the ROSSTECH 119ME solvent. The wipes should be disposable, and preferably non-woven. It is essential, especially with products such as PC boards, that the wipes be lint-free. Lint contamination of solder joints can result in gas entrapment and poor solderability during the soldering process, resulting in solder joint failure. Referring to the drawing, a canister 10 has wipes 12 disposed therein. To keep the solvent from evaporating, the wipes are placed in the resealable canister. The use of premoistened wipes eliminates the use of messy pump-type solvent dispensers and potential spillage; it also ensures that the entire wipe has been uniformly presaturated. There is also less solvent waste and less fumes and odors released into breathable workspace air, when using the presaturate wipes in resealable canisters.

The amount of solvent that is necessary to substantially saturate a wipe is determined by prior art techniques and depends on the exact composition of the wipe and the solvent to be used. A predetermined number of wipes are placed into a resealable canister along with a calculated amount of necessary solvent. When a wipe is required, one opens the canister, pulls out the desired number of wipes (typically one) and then reseals the canister.

The foregoing description has been limited to a specific embodiment of the invention. It will be apparent, however, that variations and modifications can be made to the invention, with the attainment of some or all of the advantages. Therefore, it is the object of the claims to cover all such variations and modifications as come within the true spirit and scope of the invention.

What is now claimed is:

1. A canister which comprises a number of disposable presaturated wipes, said wipes presaturated with a composition, said composition consisting of a solvent to remove flux from the surface of a PC board or substrate, said solvent consists of both approximately greater than 95.0 weight % of glycol ethers and approximately less than 5.0 weight % of alcohols, wherein said solvent is $C_nO_mH_p$ such that n=4 to 9, m=2 to 4, and p=10 to 18 and is characterized in that the solvent will solvate and remove flux from the surface of the PC board or substrate, such that there is no remaining conductive residue to permit current leakage across the surfaces of the PC boards or substrate.

2. The canister of claim 1, wherein at least 90% of the glycol ethers is 1-propoxy-2-propanol.

3. The canister of claim 1, wherein less than 5% of the glycol ether is 1-methoxy, 2-propanol.

4. The canister of wipes of claim 1, wherein the alcohol is isopropyl alcohol.

5. The canister of claim 1, wherein the specific gravity of the solvent is 0.88.

6. The canister of claim 1, wherein the evaporation rate of the solvent is 0.22 based on an evaporation rate of butyl acetate being 1.0.

7. The canister of claim 1, wherein the melting/freezing point of the solvent is −70° C.

8. The canister of claim 1, wherein the boiling point of the solvent is 150° C.

* * * * *